United States Patent [19]

Rode

[11] 4,419,178

[45] Dec. 6, 1983

[54] CONTINUOUS RIBBON EPITAXY

[76] Inventor: Daniel L. Rode, 9 Prado, St. Louis, Mo. 63124

[21] Appl. No.: 275,321

[22] Filed: Jun. 19, 1981

[51] Int. Cl.³ ............................................. C30B 29/60
[52] U.S. Cl. .................................. 156/610; 156/624; 156/DIG. 88; 136/261
[58] Field of Search .................... 156/610, 612–614, 156/DIG. 88, 624; 271/198; 427/74, 86, 87, 255.5; 148/175; 198/700, 866, 957; 136/261

[56] References Cited

U.S. PATENT DOCUMENTS

| | | | |
|---|---|---|---|
| 3,341,376 | 9/1967 | Spenke et al. | 148/175 |
| 3,441,454 | 4/1969 | Shaikh | 357/88 |
| 3,900,943 | 8/1975 | Sirtl et al. | 148/175 |
| 3,969,163 | 7/1976 | Wakefield | 156/613 |
| 3,993,533 | 11/1976 | Milnes et al. | 156/614 |
| 4,027,053 | 5/1977 | Lesk | 427/86 |
| 4,116,751 | 9/1978 | Zaromb | 156/612 |
| 4,131,659 | 12/1978 | Authier et al. | 427/86 |

OTHER PUBLICATIONS

Sarma et al., "The Tess Technique", Published in IEEE Transactions on Electron Devices, Apr. 1980, pp. 651–656.
Saxena et al., "High Efficiency AlGaAs", Published in J. Appl. Phys. (51), Aug. 1980, pp. 4501–4503.
Shaw, "Influence of Substate Orientation", 1968 GaAs Symposium, Institute of Physics and Physical Society, Oct. 1968, pp. 50–54.
DiLorenzo, "Vapor Growth of Epitaxial GaAs", Published in J. of Crystal Growth, vol. 17, Apr. 1972, pp. 189–206.

Primary Examiner—Hiram H. Bernstein

[57] ABSTRACT

A process for growing an epitaxial ribbon of monocrystalline material involves formation of an endless belt of monocrystalline composition. The belt is driven about a closed path to bring portions sequentially to epitaxial growth and ribbon stripping zones. One or more epitaxial layers of monocrystalline material at least initially compositionally different from the belt are grown on the belt in the epitaxial growth zone(s). Stripping of such epitaxial layer(s) occurs in the stripping zone to form an epitaxial ribbon of indefinite length. Finally, the ribbon is wound upon a mandrel for storage or transport before further processing. The belt is formed by slicing a boule into flat strips of uniform thickness, their ends being then beveled to preselected crystallographic orientation. Ends of the strips are juxtaposed, defining a notch between them. Material is epitaxially grown on the beveled end surfaces to fill each notch. Excess grown material is polished to coincident flatness, providing an elongated belt of uniform thickness with beveled ends. They are juxtaposed then by bending the belt within critical bending limit rules to define a final notch which similarly is filled by further epitaxial growth. Excess material thickness is polished to coincident flatness to provide a constant thickness endless belt.

10 Claims, 12 Drawing Figures

FIG. 9
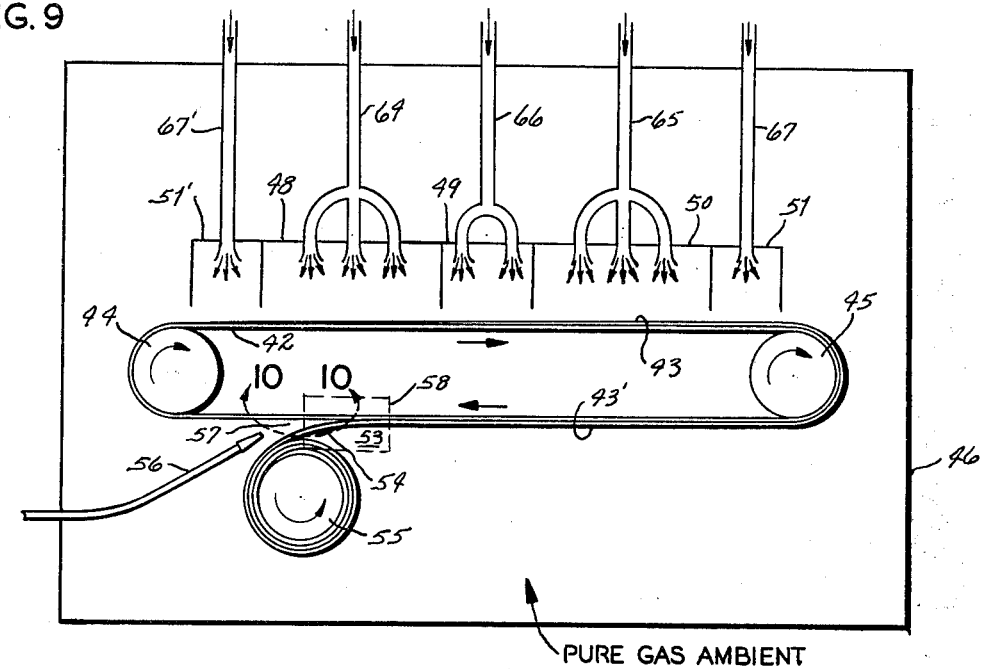
FIG. 10
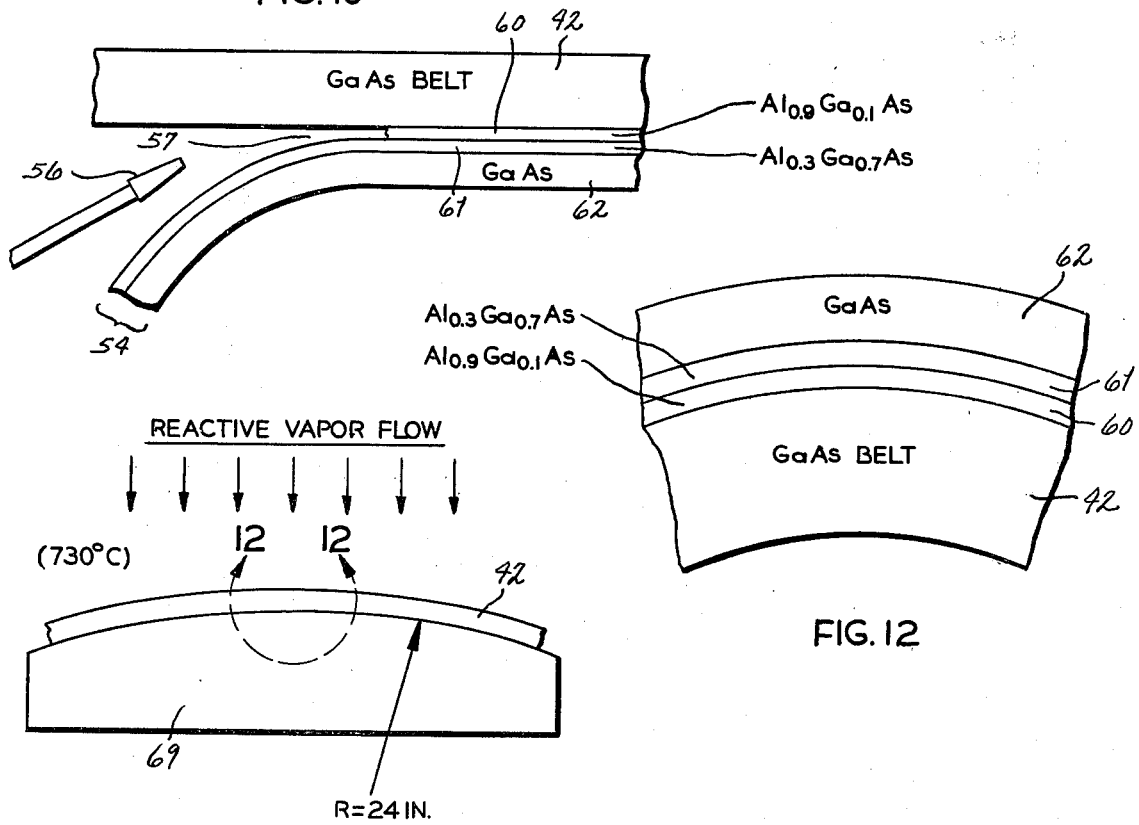
FIG. 12
FIG. 11

CONTINUOUS RIBBON EPITAXY

BACKGROUND AND SUMMARY OF THE INVENTION

This invention relates to the production of monocrystalline materials, and more particularly, to a process for producing an epitaxially grown continuous ribbon of monocrystalline composition.

There is a need for a reliable and economical method of continuously producing high-quality single-crystal (monocrystalline) materials such as semiconductors. Such a method has application to devices such as solar cells, transistors, displays, duplicating equipment, photodetectors, and optoelectronic devices.

At the present time, single-crystal materials are commonly prepared by:
1. growing single-crystal ingots;
2. sawing the ingots into thin slices;
3. polishing the slices to yield single-crystal surfaces;
4. epitaxially growing single-crystal layers on the slices;
5. processing and shaping devices on the epitaxial layers.

The series of steps has the following disadvantages:
1. ingot growth is a high-temperature method which also produces defects and consumes energy;
2. sawing is a slow process requiring expensive machinery and is wasteful of single-crystal material;
3. polishing is wasteful of single-crystal material;
4. the series of steps requires batch processing and precludes continuous processing.

There have been various attempts to create continuous processes by pulling dendritic crystals from melts or by fusing polycrystalline ribbons of silicon. For example, refer to the following U.S. Pat. Nos.: Spenke et al 3,341,376; Shaikh 3,441,454; Sirtl et al 3,900,943; Kendall et al 3,969,746 and Lesk 4,027,053.

These approaches do not allow one arbitrarily to choose crystallographic orientations which provide optimum device performances. They also yield polycrystalline material or unacceptably high concentrations of crystalline defects in the resulting ribbons.

I have invented a method by which sufficiently thin strips of single-crystal material can be bent and shaped into a continuous belt without degrading the desired high degree of quality characteristic of monocrystalline material. In addition, the crystallographic orientation of the entire major surface of the ribbon can be chosen at will to yield optimum device performance.

Briefly, my method comprehends the use of a continuous single-crystal belt which provides a substrate for continuous epitaxial growth of a variety of devices by methods such as vapor-phase epitaxy (VPE) and liquid-phase epitaxy (LPE). The epitaxial device layers are separated in continuous fashion from the belt, allowing the belt to be re-used.

Because such epitaxial growth is at relatively low temperatures and is used to grow only the quantity of material necessary for device fabrication, my new continuous process is fundamentally less wasteful of energy and materials and is more economical and reliable than the prior art.

In addition, processing according to my invention allows epitaxial growth on generally available substrate materials whose effective lattice parameter is slightly and controllably adjusted by the degree of bending.

Accordingly, it is an object of the present invention to provide an effective, advantageous new method of producing high-quality single-crystal materials such as semiconductors, and particularly a process for epitaxial growth of such monocrystalline materials for producing indefinite lengths of epitaxially grown ribbon of various materials, including metals, compounds or alloys of various inorganic elements as well as other material capable of single-crystal orientation.

Among the various other and more specific objects of the invention may be noted the provision of such a process which allows extremely high-quality, substantially defect-free monocrystalline ribbon to be continuously grown in any deisred length, or to be of indefinite length; which allows the preselection of crystalline orientations of the ribbon; which substantially minimizes or avoids wastage of energy and materials; which achieves reliable, uniform, repeatable, continuous and consistent results; and which can be carried out indefinitely without need for batching, reloading, reconfiguring or the like.

A further object is the provision of a method or process for forming an endless belt of monocrystalline material on which the epitaxial ribbon is grown, wherein the belt can not only be formed substantially without discontinuities or imperfections and in desired crystallographic orientation but also can be reused time and time again.

Generally, my new process for growing an epitaxial ribbon of monocrystalline material in accordance with the invention comprises forming an endless belt of monocrystalline composition and driving the belt about a closed path to bring portions thereof sequentially to epitaxial growth and ribbon stripping zones. There is epitaxially grown on portions of the belt in the epitaxial growth zone at least one epitaxial layer. The process further involves stripping such epitaxial layer(s) in the stripping zone to form an epitaxial ribbon of indefinite length. Finally, the ribbon is wound upon a mandrel for storage or transport before further processing.

The endless belt of monocrystalline composition is formed, according to my new invention, by slicing a boule of the first monocrystalline composition into flat strips of uniform thickness. Ends of the strips are then beveled to provide beveled end surfaces each of preselected crystallographic orientation. A plurality of the strips are joined in end-to-end relationship to define a bevel-edged notch between the strips. Then, material of said monocrystalline composition is epitaxially grown on beveled end surfaces to fill the notches. Excess thickness of the material grown into the notches is polished away to a condition of flatness coincident with surfaces of the strips, providing an elongated double-edged belt of uniform thickness having beveled end surfaces. The opposite ends of the belt are bent back upon each other in end-to-end relationship to define a final bevel-edged notch between the ends of said strip, such bending being at a radius not less than a critical minimum value. This last notch is again filled by further epitaxial growth on its beveled end surfaces, and excess thickness of this last growth is polished to a condition of flatness coincident with adjacent surfaces of those strips which defined said final notch, thus providing the endless belt.

Other objects and features of my invention are apparent or are pointed out hereinbelow.

BRIEF DESCRIPTION OF THE DRAWINGS

FIG. 9 is a simplified schematic representation of one form of apparatus for conducting a continuous epitaxial ribbon growth process of the invention.

FIG. 10 is an enlarged representation of ribbon separation, or stripping, as occurs in the course of the process carried out in FIG. 9.

FIG. 11 is an illustration of a mandrel upon which a portion of a single-crystal belt of the invention is maintained during layer growth thereon by use of vapor phase epitaxy (VPE).

FIG. 12 is an enlarged cross-section representing the layers deposited by the arrangement of FIG. 11.

DESCRIPTION OF THE PREFERRED EMBODIMENTS

Methodology

Figure 1:
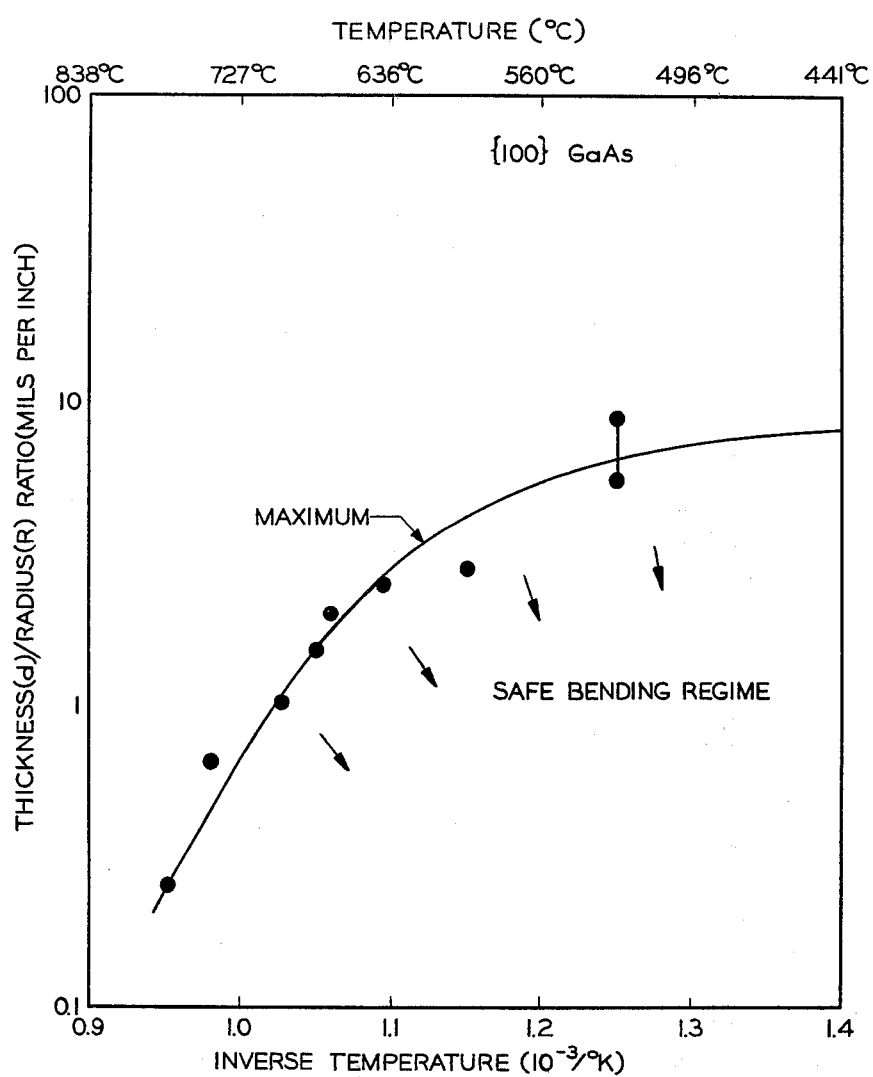
FIG. 1 is a graph depicting a bending parameter for monocrystalline gallium arsenide plotted as a function of temperature for being taken into account in practicing the process of the invention.

A process according to my present invention generally contemplates the bending of a length of a first monocrystalline composition back upon itself to form an endless belt. The belt is then driven, as described hereinbelow, to bring portions thereof sequentially to at least one epitaxial growth zone and, thereafter, to a ribbon stripping zone. In the epitaxial growth zone or zones, there is epitaxially deposited on the belt at least one epitaxial layer which, thus, also is of single-crystal form. Stripping of such epitaxial layer or layers from the belt is then carried out in the stripping zone to provide an epitaxial ribbon. The process steps are continuously repeated to produce an indefinite length of such ribbon. Accordingly, the invention provides what I have termed continuous ribbon epitaxy. Formation of the belt involves a novel methodology as hereinbelow described in detail.

Classes of Materials

Without intending to limit the invention, my new epitaxial process is useful especially for the economical production of semiconductor materials suitable for the manufacture of devices such as solar cells, transistors, displays, duplicating equipment, photodectors, and optoelectronic devices (e.g., as light-emitting diodes, luminescent panels, laser diodes, phototransistors, photodiodes, and so forth).

Accordingly, for such purposes, both the endless belt and epitaxial layer or layers grown thereon may be of materials selected from the group consisting of metals, silicon, germanium, compounds of atomic groups III and V, compounds of atomic groups II and VI, and alloys of said compounds. But more broadly, processes of the invention may involve the use of materials selected from the more general group consisting of inorganic elements and compounds, oxides, organic compounds, polymers, as well as materials capable of single-crystal orientation.

Significance of Invention to Photovoltaic Materials

As utilized, however, for the production of the more limited class of materials useful for solar photovoltaic conversion, my invention is aimed to provide a technology for economical large-scale manufacture of solar photovoltaic cells. Large numbers of such cells are needed to generate significant levels of electrical power in a future national electrical power network based on diverse primary sources of energy, e.g., fossil, nuclear, hydroelectric, and solar.

In order to achieve cost-effective solar photovoltaic conversion, the efficiency with which solar energy is converted to electrical energy must be maximized, consistent with overall system costs. For example, the solar power incident on the earth's sea-level surface is typically 74 watts per square foot at maximum and conversion to electrical power at 10 percent efficiency yields 7.4 watts per square foot of collected sunlight. On the other hand, conversion at 20 percent efficiency yields about 15 watts per square foot so that in this example the collection area need only be half as large as in the case of 10 percent efficiency for a given output power requirement. Other factors related to concentration of sunlight and system configuration also determine overall economics, but the conclusion that high conversion efficiency cells are desirable remains valid.

Semiconductor Photovoltaic Cells

The most efficient photovoltaic cells are constructed of high purity semiconductor materials such as silicon (Si), gallium arsenide (GaAs) and alloys of aluminum gallium arsenide (AlGaAs). While high purity semiconductor materials are expensive relative to many other materials used in large scale, an economically viable semiconductor technology can nevertheless exist if small quantities of semiconductor materials are used in high-efficiency cell design. Also of great importance in evaluation of economic viability is the cost of manufacture of photovoltaic cells.

From a mass-production point of view, the present invention provides for economically favorable manufacture of high-efficiency semiconductor cells when compared to existing methods. Unlike batch-fabrication methods under consideration heretofore, my invention allows continuous-fabrication methods which can lead to improved utilization of machinery and improved control over the manufacturing process. Additionally, my new method requires significantly lesser quantities of raw material to fabricate high efficiency photovoltaic cells. High efficiency semiconductor cells which provide very good performance in terms of energy conversion efficiency can be constructed from AlGaAs-GaAs layers grown epitaxially on a single-crystal belt, in lieu of a conventional substrate, in accordance with my invention. Bending of the single-crystal material constituting the belt is required, substantially without producing dislocation or other damage to the belt material. The new process creates a flexible epitaxial ribbon which similarly may undergo harmless, damage-free bending during practice of the process of the invention. Such ribbon may not only be wound upon a mandrel but also provides flexibility useful for further processing, such as into photovoltaic devices.

Photovoltaic Device Structure

Photocells constructed of epitaxial layers grown on conventional thick crystalline substrates have required rigid supporting structure for arraying and mounting of cells. Because photovoltaic devices based on ribbon epitaxially formed in accordance with my invention are inherently more mechanically flexible than their conventional counterparts based on thick substrates, the mounting hardware, materials, and supports advantageously need not be as rigid or expensive as those necessitated by prior art methodology.

Bending

All single-crystal materials involved in practicing the present invention can be bent to some degree. However, depending upon the temperature, I find that excessive bending leads to either catastrophic fracture of the crystal or to production of crystalline defects.

As an example, for a semiconductor, consider single-crystal gallium arsenide slices with major surfaces of (100) crystallographic orientation. I subject such slices to bending at various temperatures and find that there is a reproducible relationship between the thickness of the slice and the minimum bending radius R.

The results for single-crystal gallium arsenide are plotted in FIG. 1. At a given temperature the ratio d/R is a critical bending parameter to be taken into account in practicing my invention. This ratio must be maintained smaller than the values shown by the curve in FIG. 1 to avoid fracture or defect formation. For example, at a temperature of 527° C., d/R must be less than approximately 7/1000. Hence, a slice 0.007 inches thick can be safely bent with a radius not less than 1 inch. At higher temperatures, the radius must be larger, as indicated in FIG. 1.

Knowledge of these safe bending considerations allows one to form continuous belts of single-crystal material in accordance with the invention. Accordingly, a continuous belt surface of one and only one crystallographic orientation is achieved for optimized growth of epitaxial layers thereon, as described below.

Adjustment of Lattice Parameter

Figure 2:
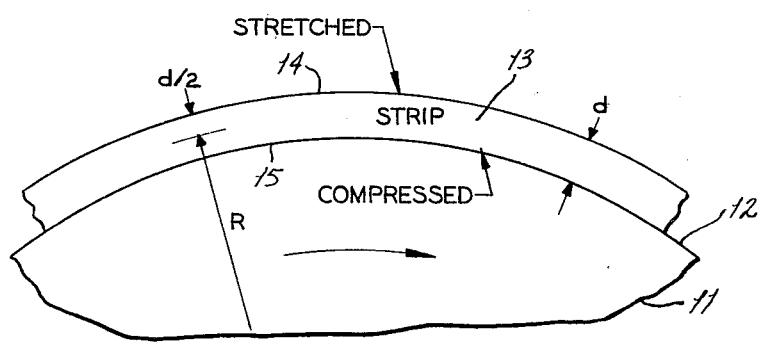
FIG. 2 is a simplied schematic illustration of bending single-crystal material about a cylindrical surface according to the invention.

Bending of a single-crystal as carried out by the invention involves also a change in lattice parameter. Thus, referring to FIG. 2, illustrated at 11 is a rotating cylindrical roller or mandrel about the surface 12 of which a strip or belt 13 of single-crystal material is being bent about a radius R in accordance with the invention, where d is the thickness of strip or belt 13.

Figure 3:
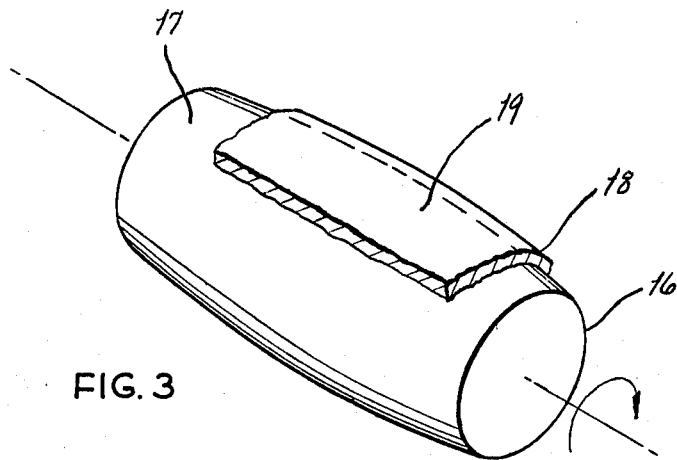
FIG. 3 is a simplified schematic illustration of a spherical or spheroidal roller about which single-crystal material is being bent.

I have determined that bending of the single-crystal material about such a convex, nonplanar object as surface 12 stretches atoms away from one another in a tangential direction in the upper surface 14 but compresses them in the lower surface 15. In FIG. 3 is shown a rotating roller 16 having a spherical or spheroidal surface 17 about which single-crystal material 18 is being bent. The consequent bending of the single-crystal into a spherically or spheroidally shaped shell causes stretching of the atoms isotropically or biaxially away from one another in the plane of the convex upper growth surface 19. Conversely, compression of the atoms toward one another occurs in the plane of the concave lower surface lying on the surface 17 of roller 16, again isotropically or biaxially.

The stretching and compression lead to an effective atomic spacing $b_o$, or lattice parameter, which differs positively or negatively from that of the unbent crystal $a_o$. I obtain $b_o = a_o + (a_o d/2R)$ where R is positive for the convex side and negative for the concave side.

As an example, the lattice parameter of gallium arsenide is $a_o = 5.6532$ Å at room temperature. If a slice of gallium arsenide of thickness d is spherically bent to a radius of $R = 146d$, then the lattice parameter at the convex surface becomes $b_o = 5.6726$ Å. This lattice parameter closely matches, within 0.1 percent, that of zinc selenide (5.667 Å), cadmium silicon diphosphide (5.678 Å), and zinc germanium diarsenide (5.672 Å). Thus, gallium arsenide which is commercially available can be used as a lattice-parameter-matched epitaxial growth belt serving effectively as a substrate for less readily available materials.

Accordingly, bending in accordance with the invention readily allows adjustment of lattice parameter of the single-crystal material forming the endless belt for matching that of single-crystal material of different composition to be epitaxially grown thereon as more specifically described below. Epitaxial growth upon the growth layer, while bent, is then permitted by the resultant substantial matching of lattice parameters.

Belt Formation

Figure 4:
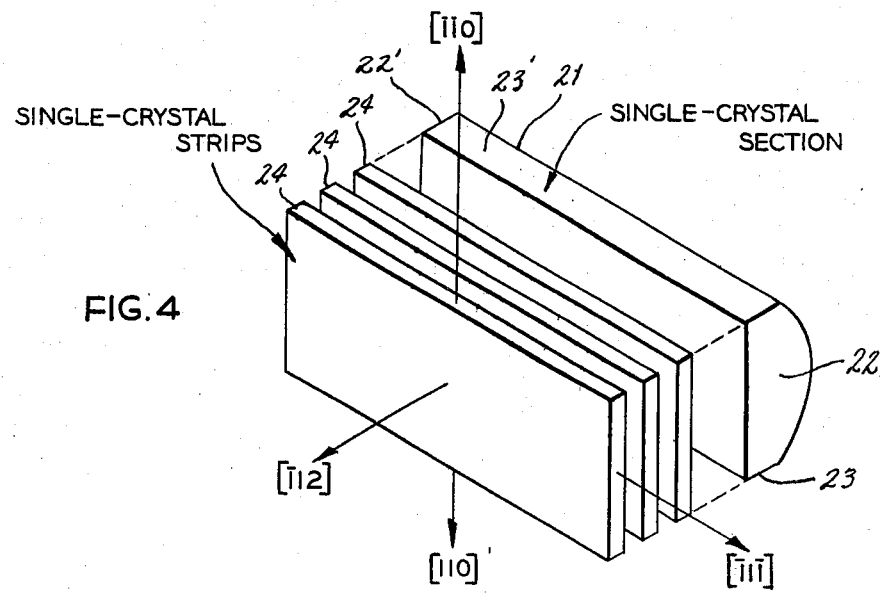
FIG. 4 is a perspective illustration of schematic nature depicting the processing of single-crystal material into strips for forming a belt used in practicing the invention.

Referring to FIG. 4, an ingot or boule of single-crystal material is sawed into a convenient length single-crystal section 21 of cylindrical form having flat ends 22, 22' perpendicular to the longitudinal axis. Section 21 is provided with opposed parallel upper and lower flats 23, 23'. The section is then sliced into numerous thin flat strips 24 having major surfaces of predetermined crystallographic orientation.

Figure 5:
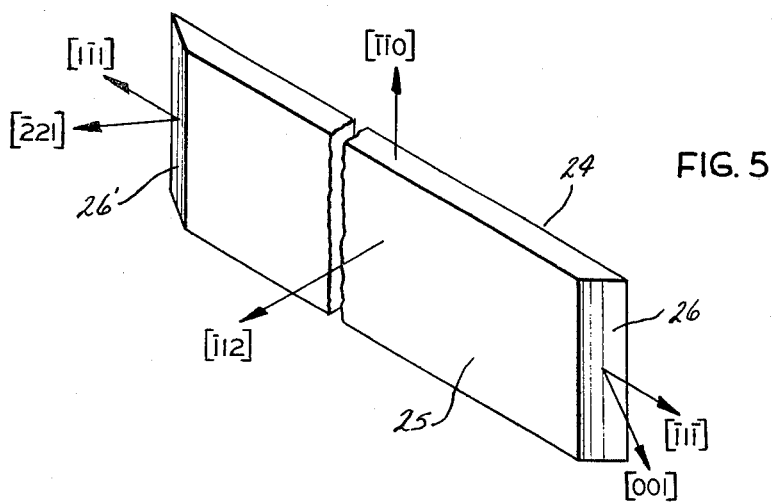
FIG. 5 is a perspective view of a bevel-ended strip as configured for being joined end-to-end with other such strips for belt formation.

Referring then to FIG. 5, each strip 24 is then further processed by lapping and polishing to form a flat surface 25 which is to become the outer surface of a belt. The ends of each strip, having first been cut to predetermined crystallographic orientation, are then sawed or lapped to provide bevelled end surfaces 26, 26' oriented with preferred crystallographic orientation.

Figure 6:
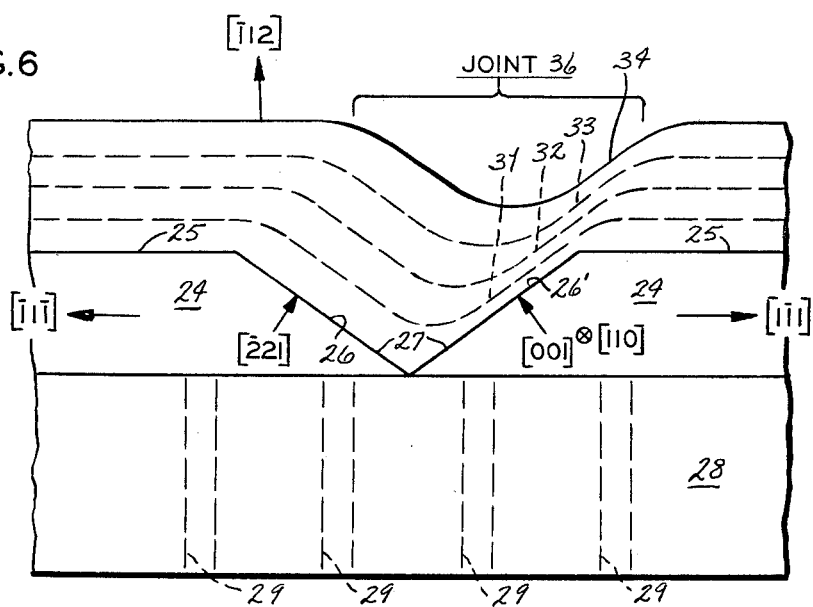
FIG. 6 is an enlarged side view of joined ends of two strips, illustrating the provision of an epitaxially grown joint.

A plurality of strips 24 are then joined in end-to-end relationship, as depicted in FIG. 6, to define a bevel-edged notch 27 between the strips. A vacuum chuck 28 having numerous vacuum apertures 29 therethrough may be used for holding abutting strips.

Utilizing one of various known vapor phase epitaxy (VPE) methods or the liquid phase epitaxy (LPE) method, material of the monocrystalline composition of the strips 24 is then grown within notch 27 until it is filled. Because of differences in the rate of growth in different crystallographic directions, such growth produces instantaneous growth fronts, as at 31, 32, 33 and 34, such as are representative at successive instants of time. The last growth front 34 is seen to provide a lowest point higher than face 25 of either strip.

Thereafter, the excess thickness of the epitaxially grown material is polished away until the material in the notch has a condition of flatness coincident with the adjacent strip surfaces 25.

Figure 7:
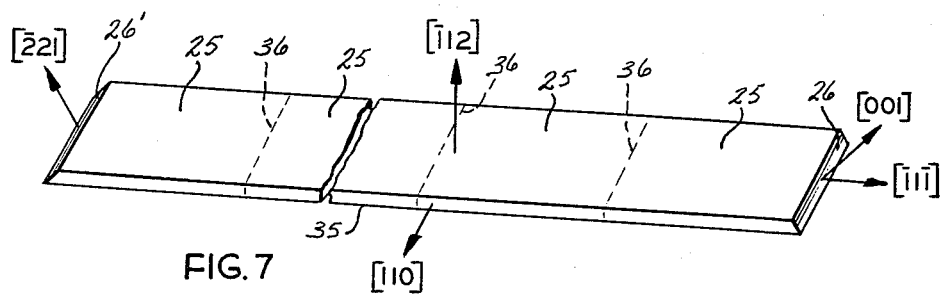
FIG. 7 is a perspective view of a composite strip of monocrystalline material formed by the joinder of numerous shorter strips.

Numerous strips 24 are joined in this manner to provide a single length of material of uniform flatness and constant width, as indicated at 35 in FIG. 7. Joints are represented at 36 by dashed lines but, of course, are not visible to the unaided eye. Beveled end edges 26, 26' remain at the opposite ends of the composite strip 35.

The opposite ends of the composite strip 35, which now forms an incomplete belt, are now bent back upon each other to define a final bevel-edged notch of the form shown in FIG. 6. The VPE deposition of material is again carried out, also as shown in FIG. 6, to fill the final notch created by the juxtaposed ends.

Thereafter, excess thickness of such finally grown material is then polished away to a condition of flatness coincident with the adjacent strip surfaces 25 of the end strips defining the final notch, thus providing a finished endless belt of monocrystalline composition.

In bending the ends of composite strip, or belt, 35 back toward each other to define the final notch, the bending is at a radius not less than the critical minimum value R defined by the curve of FIG. 1, as dependent upon the material, its orientation, its thickness d and temperature.

Of course, it should be understood that belt 35 can also be formed by joining the bevel-ended strips end-to-end with the notches being directed inward toward the center of curvature of the belt rather than outward as hereinabove described. In this case, if the material grown in the notch to join together the strips is sufficiently thin, such material need not be polished away so long as the bending rules described above are followed. This alternative, with inwardly directed notches, provides for the possibility of a true, uniform, flat surface across the belt as well as presenting a very small discontinuity between the joined strip ends which can easily be bridged by epitaxial growth, as known in the art, as occurs in a continuous growth process of this invention.

The following example further illustrates the process of forming a continuous or endless single-crystal belt in accordance with the invention.

EXAMPLE I

An ingot of gallium arsenide is grown by the liquid-encapsulated Czochralski method along the [111] crystallographic axis. The ingot is approximately 60 mm in diameter and contains about 180 mm of single-crystal length with a weight of about 2700 grams. A single-crystal cylindrical section is cut with a diamond ID saw to a length of about 150 mm with {111} flat ends perpendicular to the axis of the single-crystal cylindrical section. Two opposing flat surfaces of crystallographic orientation (110) and ($\bar{1}10$) spaced apart by 50 mm are diamond ID sawed onto the sides of the single-crystal section.

Using a diamond ID saw, the single-crystal section is sliced into 19 single-crystal strips 1.1 mm thick by about 50 mm width by about 150 mm length. The major surfaces of the strips are oriented perpendicular to the {110} surfaces and are themselves {211} crystallographic surfaces. FIG. 4 is illustrative.

The strips are mounted flat onto thick supporting plates by the molten wax method and lapped in a slurry of silicon carbide abrasive mixed with lubricant against a flat reference surface to a final thickness of 0.36 mm. To remove crystalline damage and reduce the thickness further, the strips are chemically polished in a 0.6 percent mixture of bromine in methanol to a final thickness of 0.18 mm.

The {111} ends of the strips are diamond sawed to yield {111} surfaces. The ends are then beveled at inclined angles to the {111} surfaces to obtain ends oriented along (001) and ($\bar{2}21$) crystallographic surfaces. FIG. 5 is illustrative.

The ends of four strips are joined together by conventional VPE crystal growth in the vicinity of the strip ends as shown in FIG. 6. The beveled ends are held in close proximity to one another during crystal growth by a vacuum chuck.

It is shown by J. V. DiLorenzo, *J. Crystal Growth*, 17, 189 (1972), and D. W. Shaw, Proc. of the 1968 Symposium on GaAs, p.50, that high-quality epitaxial gallium arsenide can readily be grown on the (112) surface chosen for the major strip surfaces. Shaw (op. cit. supra) in addition has shown that growth proceeds very rapidly on the (221) surface chosen for the strip end. Growth occurs at a slower rate on the opposing (001) end. This, in FIG. 6, successive crystal growth surfaces appear as shown and the depression at the joint is displaced toward the [001] strip end.

Following the joining operation, the regions in the vicinity of the joints are chemically polished in a 0.6 percent mixture of bromine in methanol to a final thickness of 0.18 mm. The resulting composite strip measures about 600 mm in length by 50 mm in width by 0.18 mm in thickness.

Figure 8:
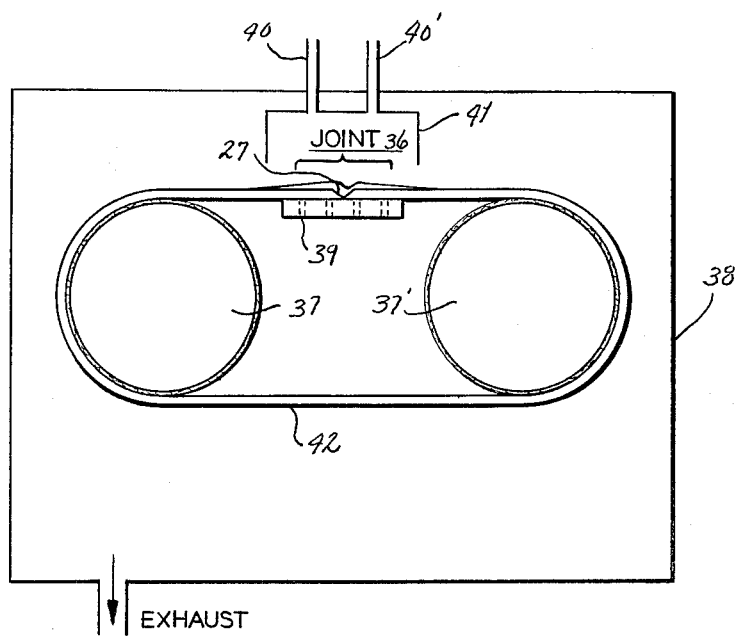
FIG. 8 is a schematic illustration of apparatus for forming the composite strip of FIG. 7 into an endless belt.

At temperatures below 500° C., the strip of thickness d=0.18 mm can be safely bent with a minimum bending radius R=1000d/7=26 mm according to FIG. 1. Consequently, the 600 mm composite strip 35 is placed over 50 mm radius springloaded mandrels 37, 37' within an enclosure 38, as shown in FIG. 8. The mandrels are protectively covered by soft padding (such as "Alphalap Velveteen", available from Universal Shellac and Supply Co., Inc., Hicksville, N.Y.). The spring load holds the strip in an oval shape while a carbon vacuum chuck 39 holds the (001) and ($\bar{2}21$) strip ends in juxtaposition during the joining process which is repeated as above described and shown in FIG. 6, wherein gaseous reactant streams are introduced through conduits 40, 40' for VPE deposition in the notch 27 occurring in a deposition chamber 41, thereby creating a joint 36. Following the joining process by such vapor-phase crystal growth, the joint is chemically polished in a 0.6 percent mixture of bromine in methanol to flatness and a final thickness of 0.18 mm, being thus coincident with the thickness of the remainder of the resultant endless belt 42.

The finished continuous gallium arsenide belt 42 is of length 600 mm, width 50 mm, and thickness 0.18 mm, is single-crystal and of one crystallographic orientation, namely ($\bar{1}12$), over its entire major surface, except for small crystalline faults near the joints. The continuous single-crystal belt serves as a substrate for continuous growth of one or more epitaxially grown layers formed by VPE or LPE processes.

Continuous Growth Process

Referring to FIG. 9, apparatus is shown in greatly simplified form for carrying out a process of the invention for continuous ribbon epitaxy, wherein epitaxial growth of monocrystalline material is carried out indefinitely. An endless belt 42 of single crystal material produced as hereinabove described is extended around a drive mandrel or roller 44 at one end and an idler mandrel or roller 45 at the other to provide horizontal disposition of surfaces of upper and lower reaches 43, 43' of the belt as they pass between mandrels 44, 45.

The apparatus includes a suitable enclosure 46 for maintaining a pure gas ambient such as an inert gas or hydrogen atmosphere. Various gas supply and exhaust ports and the like are omitted for clarity and simplification. At 48, 49 and 50 are epitaxial deposition chambers defining zones for growth of epitaxial layers of monocrystalline material depositing constituents from the vapor phase on belt reach 43 as it passes beneath, or through, chambers 48, 49, 50. At opposite ends of these chambers are purge chambers 51, 51'. Purge and/or exhaust chambers may also optionally be present between the individual deposition chambers 48, 49, 50.

Although three individual VPE deposition chambers are shown, a lesser or greater number may be employed, as well as more complex chamber arrangements for allowing graded growth. Further, the process may utilize various other chemical vapor deposition (CVD) schemes, liquid phase epitaxy (LPE), molecular beam epitaxy (MBE), gas plasma deposition, and other epitaxial growth processes, e.g., organometallic VPE (OMVPE).

However, regardless of their type and regardless whether one or more epitaxial growth zones is thus provided, as belt 42 is driven by mandrel 44 at least one epitaxial layer of monocrystalline material is deposited, i.e., grown on reach 43.

As belt 42 is further driven, the grown epitaxial layer or layers will be brought to a ribbon stripping zone 53 in which the epitaxial layer or layers can be stripped from belt 42 to form an epitaxial ribbon 54 which is wrapped upon a spooling mandrel or roller 55 for storage or transport before further processing. Preferably, although not necessarily, the epitaxial growth and stripping operations are carried out continuously, and with the belt being continuously driven by drive mandrel 44, while epitaxial ribbon is continuously wound about spooling mandrel 55. Accordingly, the belt driving, epitaxial deposition and ribbon stripping steps are continuously repeated, being preferably carried out indefinitely and uninterruptedly.

Although belt 42 could be operated with interrupted, discrete movements, preferably it is driven at a constant speed corresponding to rate of epitaxial deposition and rate of layer stripping. It should be understood that suitable heating, such as by conventional radio frequency or incandescent techniques, can be provided within enclosure 46 such as throughout the epitaxial growth zones or, as noted below, within the stripping zone 53. The distributed processing here described facilitates appropriate thermal zoning as may be desirable dependent upon the materials undergoing processing throughout the several process steps.

According to one preferred manner of carrying out the new ribbon growth process, there is first grown on the belt an intermediate epitaxial layer of composition different from belt 42. Upon the intermediate layer, one or more additional layers are epitaxially grown of composition different from the intermediate layer and either different from or the same as that of belt 42. In this latter variational realization of my process, the intermediate layer is selectively removed at the stripping station or zone 53 by chemically etching it away through selective reaction between the intermediate layer and etchant.

Referring still to FIG. 9, at 56 is designated a conduit for introducing into a region 57 between ribbon 54 and belt reach 43' a fluid stream of selective etchant, preferably in the form of a vapor. Thus, by disposition of appropriate nozzles or orifices at the discharge end of conduit 56, the vapor stream of selective etchant is directed at the interface provided by the intermediate epitaxial layer for selectively dissolving the same, i.e., etching it away, thereby to break the epitaxial bond between belt 42 and the upper epitaxial layer or layers which, being substantially unaffected by the etchant, become ribbon 54.

As exemplary of etchants to be so employed, if belt 42 is of AlGaAs and the intermediate layer is of GaAs having a further layer or layers of AlGaAs thereon, an aqueous etchant of $H_2O_2+NH_4OH$ selectively etches GaAs but not AlGaAs. Conversely, assume as shown in FIG. 10 that belt 42 is of GaAs having an intermediate epitaxial layer 60 thereon of the composition $Al_{0.9}Ga_{0.1}As$. Layer 60 carries an epitaxial layer 61 of $Al_{0.3}Ga_{0.7}As$ which in turn carries a further uppermost layer 62 of GaAs. An etchant flow of HCl or HF (or both) directed against intermediate layer 60 will selective etch layer 60 to separate layers 61 and 62 intact from belt 42 as a single, thin ribbon 54.

Another typical structure readily amenable to etching of intermediate layer 60 will the mixture HCl+HF is that in which the belt is GaAs, layer 60 is $Al_xGa_{1-x}As$, where $x \geq 0.6$ and of thickness, e.g., $0.5\mu$, layer 61 thereabove is GaAs of thickness of $1-5\mu$ and ultimate layer 62 is of $Al_{0.3-0.4}Ga_{0.7-0.6}As$ of nominal thickness $0.5\mu$ serving as a window layer, and layer 61 being an active layer for photocell structures. For deposition of such layers, in the apparatus of FIG. 9, vapor sources of AlGaAs are provided through conduits 64 and 65 to chambers 48 and 50, respectively, and a vapor source of GaAs is provided through a conduit 66 to chamber 49. Conduits 67, 67' provide a purge gas, such as an inert gas, to chambers 51, 51'.

As further examples, HCl etches InP, as an intermediate layer, but not InGaAsP, as a belt or a supraintermediate or ultimate layer. The acid $H_2SO_4$ similarly etches InGaAsP but not InP.

The foregoing is not intended to limit the invention to purely etchant removal of layers. Accordingly, various liquid and/or vapor phase separations of the ribbon from the belt can be utilized, as well as plasma separations or dry etching methods employing reactive ion separation schemes such as may involve use of halogenated compounds, e.g., carbon tetrachloride and carbon tetrafluoride, as well as halogenated hydrocarbons such as various of those sold under the trade name "FREON".

Without restricting the invention, typical of the many specific materials utilizable, and within the broader classes of materials hereinabove identified, are the use for belt 42 of pure metals such as monocrystalline silicon and germanium, various binary, tertiary and quaternary, etc., compositions such as those utilizing III-V elements including gallium, aluminum, indium, arsenic, phosphorus, antimony and II-VI elements, as well as alloys or compounds of Groups II, IV, and V, such as zinc germanium diarsenide. Other typical materials include cadmium silicon diphosphide, zinc selenide, sapphire, and so forth.

It may here be noted that under some circumstances, it can be desirable in the practice of the invention to utilize a particular layer composition (e.g., of $Al_xGa_{1-x}As$, where $0<x<1$) to provide a selected lattice constant as compared with that of belt 42 (e.g. of GaAs)

or of an intermediate or suprainterrmediate layer (e.g., of $Al_yGa_{1-y}As$) resulting in a lattice mismatch for providing bi-layer ribbon 54 with an intrinsic strain resulting from epitaxial growth of the one composition over the other composition below, causing the ribbon to curl away from the belt upon selective etching of intermediate layer 60. Such enhances the separation, by etching, or thermal stripping, or subsequent spooling, or both.

Alternatively, ribbon 54 can be stripped from belt 42 by exposing the belt and the epitaxial layer or layers thereon to thermal shear stresses, such as by RF heating within a heating zone 58, to cause thermal expansion shear stripping from belt reach 43' of the epitaxial layer or layers thereon, such as by using the so-called TESS method by which polycrystalline silicon ribbon is stripped from temporary molybdenum substrates described by K. Sarma and M. Rice in "The Thermal Expansion Shear Separation (TESS) Technique for Producing Thin Self-Supporting Silicon Films for Low-Cost Solar Cells", IEEE Trans. on Electron Devices, 27, 651–654 (1980), herein incorporated by reference. Here, formation of a dense network of crossed misfit dislocations during the epitaxial deposition of the layer or layers on belt 42, as heretofore known in the art of hetero-epitaxy, allows the TESS procedure to be utilized.

Generally, use of the TESS technique requires that the first epitaxial layer deposited on the belt be provided with a thermal expansion coefficient different from that of the belt. Then, upon exposing the belt and epitaxial layers thereon to heat in heating zone 58, thermal shear stresses are generated at the epitaxial layer-belt interface which are sufficient to produce stripping of all layers from the belt. Accordingly, ribbon 54 is effectively peeled from belt 42 by the thermally generated stresses. Again, lattice mismatch between epitaxial layers, or between the belt 42 and first epitaxial layer thereon, as described above can be used for causing ribbon 54 to curl away from belt 42, as well as enhancing the TESS technique during stripping of the ribbon.

Further, selected epitaxial growth of the layers while undergoing bending over a cylindrical, spherical, or spheroidal roller as hereinabove described may be utilized to provide lattice matching during growth to facilitate TESS-implemented stripping. Further, it is contemplated that bending of belt 42 with an epitaxial layer or layers thereon may, if desired to enhance stripping, be carried out consistent with the bending rules established by FIG. 1, as determined by the composition of the belt and layer(s) thereon.

As concerns the use of GaAs as belt 42, use of the orientations such as ($\bar{1}12$) for the major surface of the ribbon is felt to be preferable because (111) ingots are readily available and epitaxial growth on (112) surfaces is known.

In addition, a ribbon of such orientation contains no natural cleavage planes of (110) type lying along radial directions so a more rugged ribbon results. Nevertheless, epitaxial growth on other orientations such as (100), (111), and ($\bar{1}\bar{1}\bar{1}$) is known and can be utilized in practicing the invention.

Indeed, exceptionally high-quality epitaxial growth can be achieved on single-crystal surfaces critically misoriented by small amounts as shown by Rode in U.S. Pat. No. 4,050,964 and by Allegretti in U.S. Pat. No. 3,325,314. These and related methods can be utilized in conjunction with the present invention.

The following example illustrates the epitaxial deposition which is involved in a ribbon growth process of the invention:

EXAMPLE II

This example describes the growth of solar grade epitaxial ribbon layers on an endless belt as previously described.

A continuous belt of single-crystal GaAs is formed by joining strips cut from an ingot whose major axis is a <100> direction. The joining method is similar to that described in EXAMPLE I except that the major surfaces of the belt are misoriented from {100} surfaces by 3° toward second-nearest {110} planes. The joints are fabricated by vapor-phase epitaxy on approximate {111} beveled ends. The 3° misorientation has been shown by DiLorenzo, supra, to yield high-quality GaAs epitaxy. The thickness of the belt is adjusted to about 0.18 mm by chemical polishing and etching in a 0.6 percent mixture of bromine in methanol.

Epitaxial layers are grown on a portion of the belt by placing part of the belt in the hot zone of a vapor-phase crystal-growth reactor at a temperature of 730° C., as shown in FIG. 11 on a vacuum-chucked graphite mandrel 69. The bending radius of the hot portion of the belt is maintained by mandrel 69 greater than about 24 in. in accordance with the data of FIG. 1 which requires a minimum bending radius of 12 in. for this temperature.

Epitaxial layers are deposited by use of organometallic vapors as described by R. R. Saxena et al, in "High-Efficiency AlGaAs/GaAs Concentrator Solar Cells by Organometallic Vapor Phase Epitaxy", J. Appl. Phys. 51 (8), 4501–4503, (1980). These authors have shown that high-efficiency solar cells containing GaAs and AlGaAs can be prepared by use of organometallic vapor-phase epitaxy (OMVPE). Accordingly, OMVPE is used to deposit a first epitaxial layer 60 of $Al_{0.9}Ga_{0.1}As$ about 0.8μ thick as shown schematically in FIG. 12.

During the final stages of growth of the first epitaxial layer, the trimethylaluminum vapor source of aluminum is decreased to yield a second epitaxial layer 61 of $Al_{0.3}Ga_{0.7}As$ about 0.5μ thick. Finally, the trimethylaluminum source is shut off during the growth of a third epitaxial layer 62 of GaAs about 3.2μ thick.

The resulting three-layer heterostructure deposit is epitaxial and single-crystal over most of the area of the deposit. The surface of the deposit is smooth and mirror-like, as expected for high-quality epitaxial growth.

X-ray diffraction measurements of the three-layer deposit confirm the single-crystal nature of the epitaxial layers. The orientation of the deposit is confirmed to be 3° off {100}, demonstrating coherent registration with the single-crystal GaAs belt 42 used in lieu of a substrate.

The foregoing example illustrates but one of various possible types of epitaxial depositions which may be utilized in the course of practicing a continuous ribbon growth process of my invention.

By choosing other combinations of epitaxial layer compositions and thicknesses, and by including dopant gases such as hydrogen sulfide or diethylzinc, one can grow various epitaxial structures with n-type or p-type doping. Such other structures might be fabricated by known methods into devices such as solar cells, transistors, displays, duplicating equipment, photodetectors, or opto-electronic devices.

In addition, continuously passing belt 42 through the various stages of a multi-stage epitaxial growth reactor, as in FIG. 9, provides continuous growth of a multilayer epitaxial structure as depicted in FIG. 10.

The advantages of the approach thus taken in carrying out the invention are, inter alia, that (1) substrate slicing and polishing are not necessary; (2) only the required amount of single-crystal material needed for the device to function is prepared; and (3) the benefits of economy and quality control characteristic of continuous processing are realized.

In view of the foregoing, the various objects of the invention are attained and numerous additional advantages result.

Although the foregoing includes a description of the best mode contemplated for carrying out the invention, various modifications are contemplated.

As various modifications could be made in the methods and constructions herein described and illustrated without departing from the scope of the invention, it is intended that all matter contained in the foregoing description or shown in the accompanying drawings shall be interpreted as illustrative rather than limiting.

What is claimed is:

1. A process for the epitaxial growth of monocrystalline materials comprising the steps of:
   (a) driving an endless belt of a first monocrystalline composition to bring portions thereof sequentially to at least one epitaxial growth zone and to a ribbon stripping zone;
   (b) epitaxially depositing on said belt in said epitaxial growth zone at least one epitaxial layer of monocrystalline material;
   (c) further driving said belt to bring said epitaxial layer to said separation zone;
   (d) stripping said epitaxial layer from said belt to form an epitaxial ribbon; and
   (e) repeating steps (a) through (d) continuously and uninterruptedly to produce a continuous length of monocrystalline said epitaxial ribbon.

2. A process for forming an endless belt of monocrystalline composition comprising the steps of:
   (a) slicing from a boule of said first monocrystalline composition a flat strip of uniform thickness;
   (b) beveling ends of said strip to provide beveled end surfaces each of preselected crystallographic orientation;
   (c) bending the opposite ends of said strip back upon each other in end-to-end juxtaposed relationship to define a bevel-edged notch between the ends of said strip, said bending being at a local radius not less than a local critical minimum radius; and
   (d) epitaxially growing material of said monocrystalline composition on said beveled end surfaces to fill said notch, thereby to provide said endless belt.

3. A process according to claim 2 including said belt having a curvature at no point along its length defining a radius less than a critical minimum value.

4. A process according to claim 1 or 2, including said belt and each said epitaxial layer being selected from the group consisting of inorganic elements and compounds, oxides, organic compounds, polymers, and other material capable of single-crystal orientation.

5. A process according to claims 1 or 2, including said belt and each said epitaxial layer being of materials selected from the group consisting of metals, silicon, germanium, compounds of atomic groups III and V, compounds of atomic groups II and VI, and alloys of said compounds.

6. A process for forming an endless belt of monocrystalline composition comprising the steps of:
   (a) slicing a boule of said first monocrystalline composition into flat strips of uniform thickness;
   (b) beveling ends of said strips to provide beveled end surfaces each of preselected crystallographic orientation;
   (c) joining a plurality of said strips in end-to-end relationship to define a bevel-edged notch between the strips;
   (d) epitaxially growing material of said monocrystalline composition on said beveled end surfaces to fill said notches;
   (e) bending the opposite ends of said belt back upon each other in end-to-end juxtaposed relationship to define a final bevel-edged notch between the ends of said strip, said bending being at a radius not less than a critical minimum value; and
   (f) repeating step (d), thereby to provide said endless belt.

7. A process according to claims 2 or 6 including the step of polishing excess thickness, of the material grown on said beveled end surfaces to fill said notch or notches, to a condition of flatness coincident with adjacent surfaces of said strip or strips, thereby to provide an elongated double-edged belt of uniform thickness.

8. A process for epitaxial deposition of a material of a first monocrystalline composition and corresponding first lattice parameter upon a layer of material of a second monocrystalline composition and corresponding second lattice parameter, said first and second lattice parameters being ordinarily different and providing a mismatch for epitaxial growth of said first composition upon said second composition, characterized by bending said layer of material upon a nonplanar bending surface to stretch atoms in the growth surface plane of said layer for increasing said second lattice parameter sufficiently to provide an effective second lattice parameter substantially matched to said first lattice parameter, said bending being at a local radius not less than a local critical minimum radius, and thereafter epitaxially growing material of said first composition upon the bent material of said second composition.

9. A process according to claim 8 and further characterized by said bending surface being spherical for causing isotropic stretching of atoms in said growth surface plane.

10. A process according to claim 8 and further characterized by said bending surface being spheroidal for causing biaxial stretching of atoms in said growth surface plane.

* * * * *